(12) United States Patent
Nagatsuka et al.

(10) Patent No.: US 7,671,434 B2
(45) Date of Patent: Mar. 2, 2010

(54) ELECTRONIC COMPONENT, LASER DEVICE, OPTICAL WRITING DEVICE AND IMAGE FORMING APPARATUS

(75) Inventors: Eiichi Nagatsuka, Ebina (JP); Yasumasa Asaya, Ebina (JP); Kaoru Shida, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 404 days.

(21) Appl. No.: 11/636,626

(22) Filed: Dec. 11, 2006

(65) Prior Publication Data

US 2007/0281453 A1 Dec. 6, 2007

(30) Foreign Application Priority Data

May 31, 2006 (JP) .............. 2006-151129

(51) Int. Cl.
*H01L 31/0232* (2006.01)
*H01L 23/02* (2006.01)

(52) U.S. Cl. ............ 257/432; 257/433; 257/704; 257/680; 257/E23.002

(58) Field of Classification Search .......... 257/704, 257/680, 432, 433, E23.002
See application file for complete search history.

(56) References Cited

U.S. PATENT DOCUMENTS

| | | | | |
|---|---|---|---|---|
| 5,532,513 A | * | 7/1996 | Smith et al. ............ | 257/703 |
| 5,565,235 A | * | 10/1996 | Baudrand et al. ........ | 438/612 |
| 5,626,972 A | * | 5/1997 | Moysan et al. .......... | 428/627 |
| 5,783,818 A | * | 7/1998 | Manabe et al. .......... | 250/239 |
| 6,392,309 B1 | * | 5/2002 | Wataya et al. .......... | 257/796 |
| 6,924,974 B2 | * | 8/2005 | Stark ................ | 361/679.01 |
| 7,576,427 B2 | * | 8/2009 | Potter ................ | 257/710 |
| 2003/0080411 A1 | * | 5/2003 | Baek et al. ............ | 257/704 |
| 2005/0116352 A1 | * | 6/2005 | Warashina et al. ...... | 257/777 |

FOREIGN PATENT DOCUMENTS

| | | |
|---|---|---|
| JP | A-57-160189 | 10/1982 |
| JP | 11-126838 | 5/1999 |
| JP | A-11-354685 | 12/1999 |
| JP | A-2001-267674 | 9/2001 |
| JP | 2004-153080 | 5/2004 |

* cited by examiner

*Primary Examiner*—Nitin Parekh
(74) *Attorney, Agent, or Firm*—Morgan Lewis & Bockius LLP

(57) ABSTRACT

An electronic component includes: a base a seal body fixed to the base, constituting a hermetically sealed space together with the base; and an electronic component main body attached to a metal substrate via an adhesive containing silver within the hermetically sealed space. The base has a nickel plated layer, substantially not containing phosphor, on the seal body side.

9 Claims, 10 Drawing Sheets

ELECTRONIC COMPONENT, LASER DEVICE, OPTICAL WRITING DEVICE AND IMAGE FORMING APPARATUS

BACKGROUND

The present invention relates to an electronic component, a laser device, an optical writing device using the laser device and an image forming apparatus using the optical writing device.

1. Technical Field

In a laser device, a seal body (cap) is fixed to a base (eyelet), and hermetically sealed space is formed with the base and the seal body. A laser light emitting element or the like as an electronic component main body is placed within the hermetically sealed space.

2. Related Art

An electronic component having a base, a seal body fixed to the base, forming hermetically sealed space together with the base, and an electronic component main body attached to a metal substrate via an adhesive containing silver within the hermetically sealed space, has inconvenience of leakage of minute electric current between an anode and a cathode of the electronic component.

The present inventors have found that sliver migration causes leakage of minute electric current. The silver migration means a phenomenon that ionized silver is precipitated in an insulating layer by electrochemical reaction to direct-current electric field. The silver migration generally occurs by moisture in atmosphere.

However, the present inventors have found another factor of the silver migration. That is, as shown in Japanese Published Unexamined Patent Application No. Hei 11-354685, when an electroless nickel plated layer is formed in the base, phosphor in the electroless nickel plated layer is discharged into the hermetically sealed space by heat in fixing of the seal body to the base by resistance welding or brazing. As the phosphor discharged in the hermetically sealed space has a high moisture absorption characteristic, it absorbs moisture in the hermetically sealed space and is ionized. It can be considered that the ionized phosphor further ionizes silver of the silver paste, thus causing silver migration.

SUMMARY

According to an aspect of the invention, there is provided an electronic component including: a base; a seal body fixed to the base, constituting a hermetically sealed space together with the base; and an electronic component main body attached to a metal substrate via an adhesive containing silver within the hermetically sealed space. The base has a nickel plated layer, substantially not containing phosphor, on the seal body side.

BRIEF DESCRIPTION OF THE DRAWINGS

Exemplary embodiments of the present invention will be described in detail based on the following figures, wherein.

DETAILED DESCRIPTION

Next, exemplary embodiments of the present invention will be described with reference to the drawings.

Figure 1:
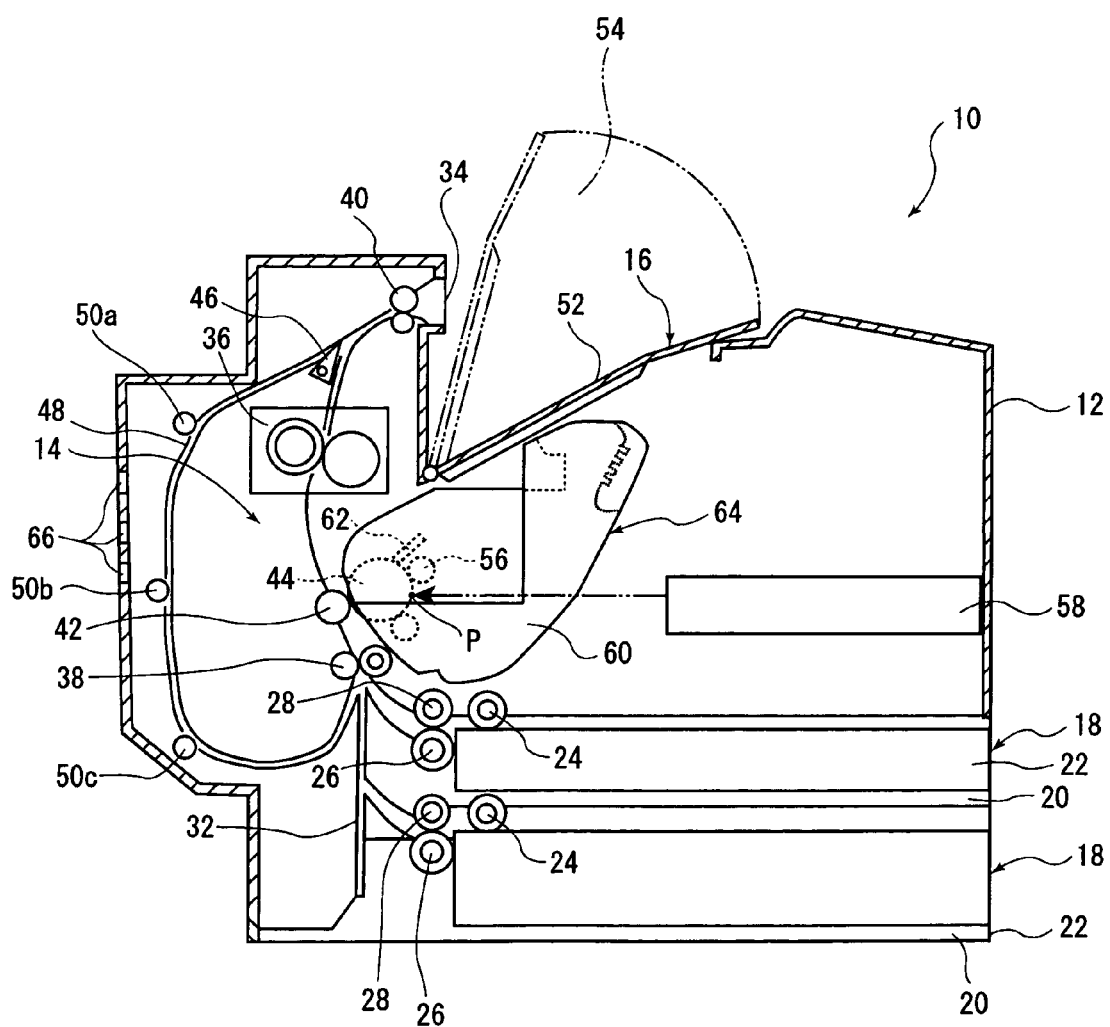
FIG. 1 is a cross-sectional view of an image forming apparatus according to an exemplary embodiment of the present invention.

FIG. 1 shows the outline of an image forming apparatus 10 according to an exemplary embodiment of the present invention. The image forming apparatus 10 has an image forming apparatus main body 12. An image forming unit 14 is mounted in the image forming main body 12. A discharge part 16 to be described later is provided in an upper part of the image forming apparatus main body 12, and paper feeding units 18, in the form of e.g. a two-layer unit, is provided in a lower part of the image forming apparatus main body 12. Further, plural optional paper feeding units may be provided under the image forming apparatus main body 12, The respective paper feeding units 18 have a paper feeding unit main body 20 and a paper feed cassette 22 in which sheets are set. A pickup roller 24 is provided in an upper position around the back end of the paper feed cassette 22, and a retard roller 26 and a feed roller 28 are provided in the rear of the pickup roller 24.

A main conveyance path 32 is a paper passage from the feed roller 28 to a discharge outlet 34. The main conveyance path 32 is positioned around the rear side of the image forming apparatus main body 12 (the left side surface in FIG. 1). The main conveyance path 32 has a portion approximately vertical from the paper feeding unit 18 to a fixing device 36 to be described later. A transfer device 42 and an image holder 44 to be described later are provided on the upstream side of the fixing device 36 of the main conveyance path 32. Further, a registration roller 38 is provided on the upstream side of the transfer device 42 and the image holder 44. Further, a discharge roller 40 is provided around the discharge outlet 34 of the main conveyance path 32.

Accordingly, a sheet sent with the pickup roller 24 from the paper feed cassette 22 of the paper feeding unit 18 is handled in cooperation between the retard roller 26 and the feed roller 28, and only the top sheet is guided to the main conveyance path 32. The sheet is temporarily stopped with the registration roller 38, then passed between the transfer device 42 to be described later and the image holder 44 at controlled timing. At this time, a developed image is fixed onto the sheet by the fixing device 36, and the sheet is discharged with the discharge roller 40 from the discharge outlet 34 to the discharge part 16.

Note that in the case of double-sided printing, the sheet is returned to a reverse path. That is, a portion of the main conveyance path 32 in front of the discharge roller 40 is branched into two parts and a switching device 46 is provided in the branching portion, and a reverse path 48 is formed from the branched part to the registration roller 38. Conveyance rollers 50a to 50c are provided on the reverse path 48. In the case of double-sided printing, the switching device 46 is turned to a side to open the reverse path 48, then the discharge roller 40 is reversed when the rear end of the sheet is brought into contact with the discharge roller 40. The sheet is guided into the reverse path 48 then passed through the registration roller 38, the transfer device 42, the image holder 44 and the fixing device 36, and is discharged from the discharge outlet 34 to the discharge part 16.

The discharge part 16 has an inclined surface 52 rotatable with respect to the image forming apparatus main body 12. The inclined surface 52 is gently sloped around the discharge outlet then gradually steeply sloped toward the front direction (rightward direction in FIG. 1). The portion of the discharge outlet corresponds to a lower end of the inclined surface 52, while the portion of the high end corresponds to an upper end of the inclined surface 52. The inclined surface 52 is supported, rotatably about the lower end, with the image forming apparatus main body 12. As indicated with an alternate long and dashed double-dotted line in FIG. 1, when the inclined surface 52 is rotated upward to be opened, an opening 54 is formed such that a process cartridge 64 to be described later is attached/removed via the opening 54.

The image forming unit 14, which is e.g. an electrophotographic unit, has the image holder 44 having a photo conductor, a charging device 56 having e.g. a charging roller to uniformly charge the image holder 44, an optical writing device 58 which optically writes a latent image on the image holder 44 charged by the charging device 56, a developing unit 60 which visualizes the latent image on the image holder 44 formed by the optical writing device 58 with developing material, the transfer device 42 having e.g. a transfer roller to transfer the developed image by the developing unit 60 onto a sheet, a cleaning device 62 having e.g. a blade to clean developing material remaining on the image holder 44, and the fixing device 36 which fixes the developed image on the sheet, transferred by the transfer device 42, to the sheet.

The process cartridge 64 is the integration of the image holder 44, the charging device 56, the developing unit 60 and the cleaning device 62. The process cartridge 64 is provided directly under the inclined surface 52 of the discharge part 16. As described above, the process cartridge 64 is attached/removed via the opening 54 formed when the inclined surface 52 is opened.

Figure 2:
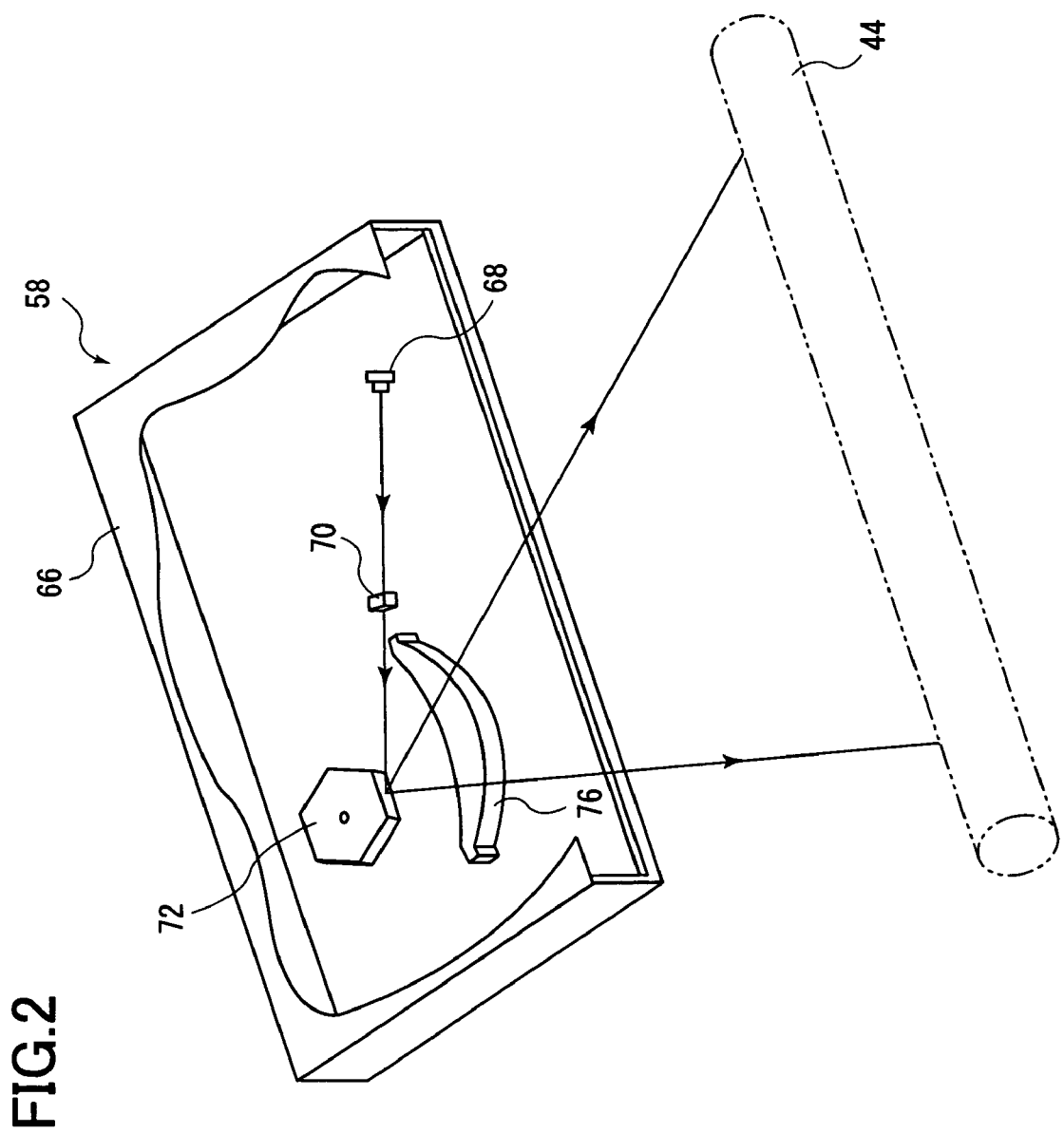
FIG. 2 is a perspective view of an optical writing device according to the exemplary embodiment of the present invention.

FIG. 2 shows the optical writing device 58. The optical writing device 58 has a laser device 68 to emit a laser beam in a housing 66. The laser beam emitted from the laser device 68 is collimated with a collimator lens 70 and reflected with a rotating polygon mirror 72. The rotating polygon mirror 72, having e.g. six deflecting surfaces (mirror surfaces), reflects the laser beam collimated with the collimator lens 74 toward an fθ lens 76 while it is rotated by a motor (not shown) at a predetermined constant angular velocity. The laser beam reflected with the rotating polygon mirror 72 is transmitted through the fθ lens 76, thereby scans an image area on the image holder 44 in a fast-scanning direction at an approximately constant velocity.

Figure 3:
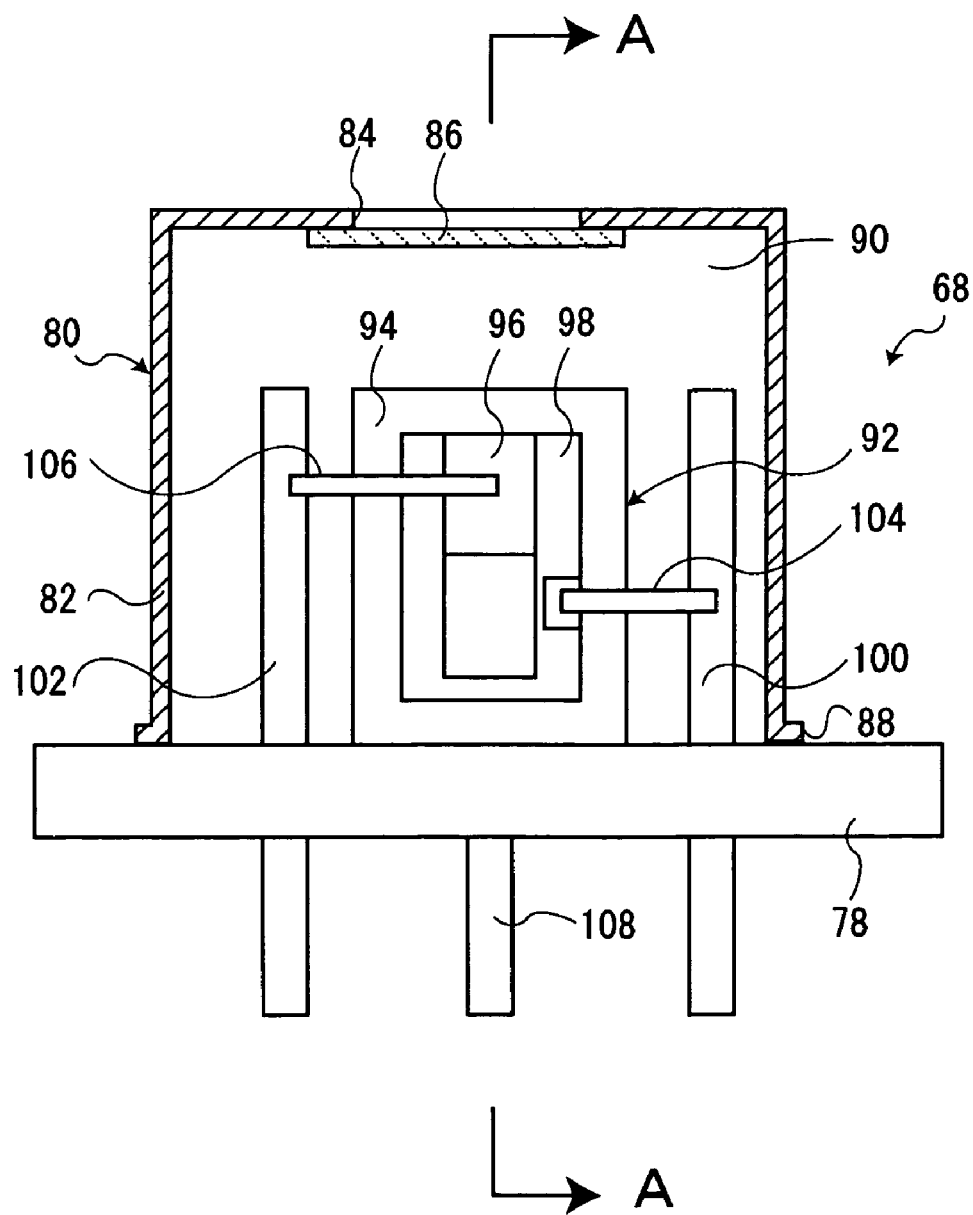
FIG. 3 is a cross-sectional view of a laser device according to the exemplary embodiment of the present invention.
Figure 4:
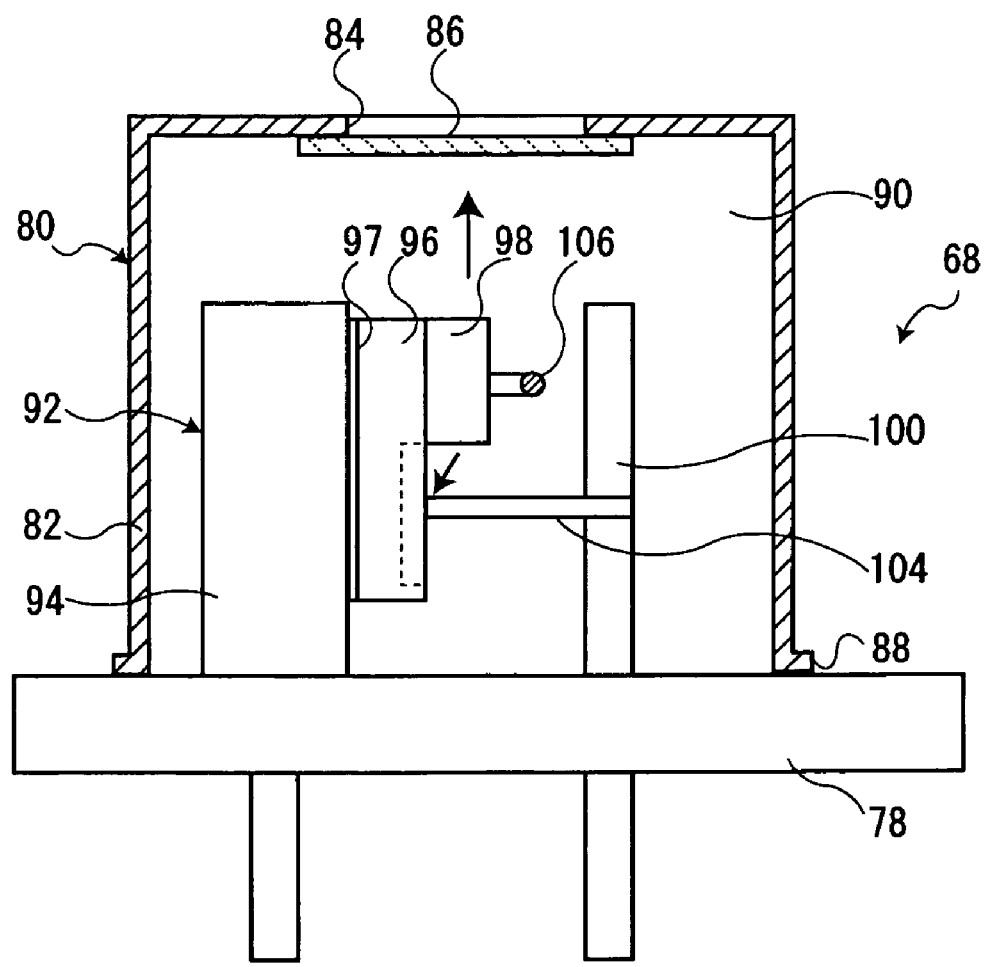
FIG. 4 is a cross-sectional view of the laser device according to the exemplary embodiment of the present invention cut along a line A-A in FIG. 3.

FIGS. 3 and 4 show the laser device 68 as an electronic component. The laser device 68 has a base 78 and a seal body 80 fixed to one surface of the base 78. The seal body 80 has a cap 82 as a seal body main body. A transparent member 84 is formed at the center of an upper surface of the cap 82. The transparent member 84 is sealed with seal glass 86 having e.g. a circular or polygonal shape. A flange 88 is formed in a lower surface of the seal body 80, and the flange 88 is fixed to the base 78 by resistance welding or brazing. The base 78 and the seal body 80 form hermetically sealed space 90.

An electronic component main body 92 is provided in the hermetically sealed space 90. In the present exemplary embodiment, the electronic component 92 has a holding base 94, a light sensing element 96 fixed to the holding base 94 and a light emitting element 98 fixed to the light sensing element 96. The holding base 94, the light sensing element 96 and the light emitting element 98 are built up in approximately parallel with each other.

The holding base 94 as a metal substrate, which is integrated with the base 78, is formed by using an alloy containing iron and nickel. The holding base 94 and the light sensing element 96 are die-bonded with silver paste 97 in consideration of conductivity, thermal conductivity, adhesivity and the like. The light sensing element 96 is a semiconductor device of silicon. The light sensing element 96 is provided for receiving monitor light emitted from the light emitting element 98 for monitoring the light quantity of the light emitting element 98. The light emitting element 98 is a semiconductor device of gallium arsenide. The laser beam emitted from the light emitting element 98 is outputted via the seal glass 86 from the transparent member 84. The light sensing element 96 and the light emitting element 98 are die-bonded with brazing filler metal of e.g. Au—Sn alloy.

First lead 100 and second lead 102, insulated by the base 78, are projected in the hermetically sealed space 90. The first lead 100 is connected to the anode of the light sensing element 96 via a metal first connection line (wire) 104. The second lead 102 is connected to the cathode of the light emitting element 98 via a metal second connection line (wire) 106. A third lead 108, as a common electrode for the cathode of the light sensing element 96 and the anode of the light emitting element 98, is connected to the base 78.

Figure 5:
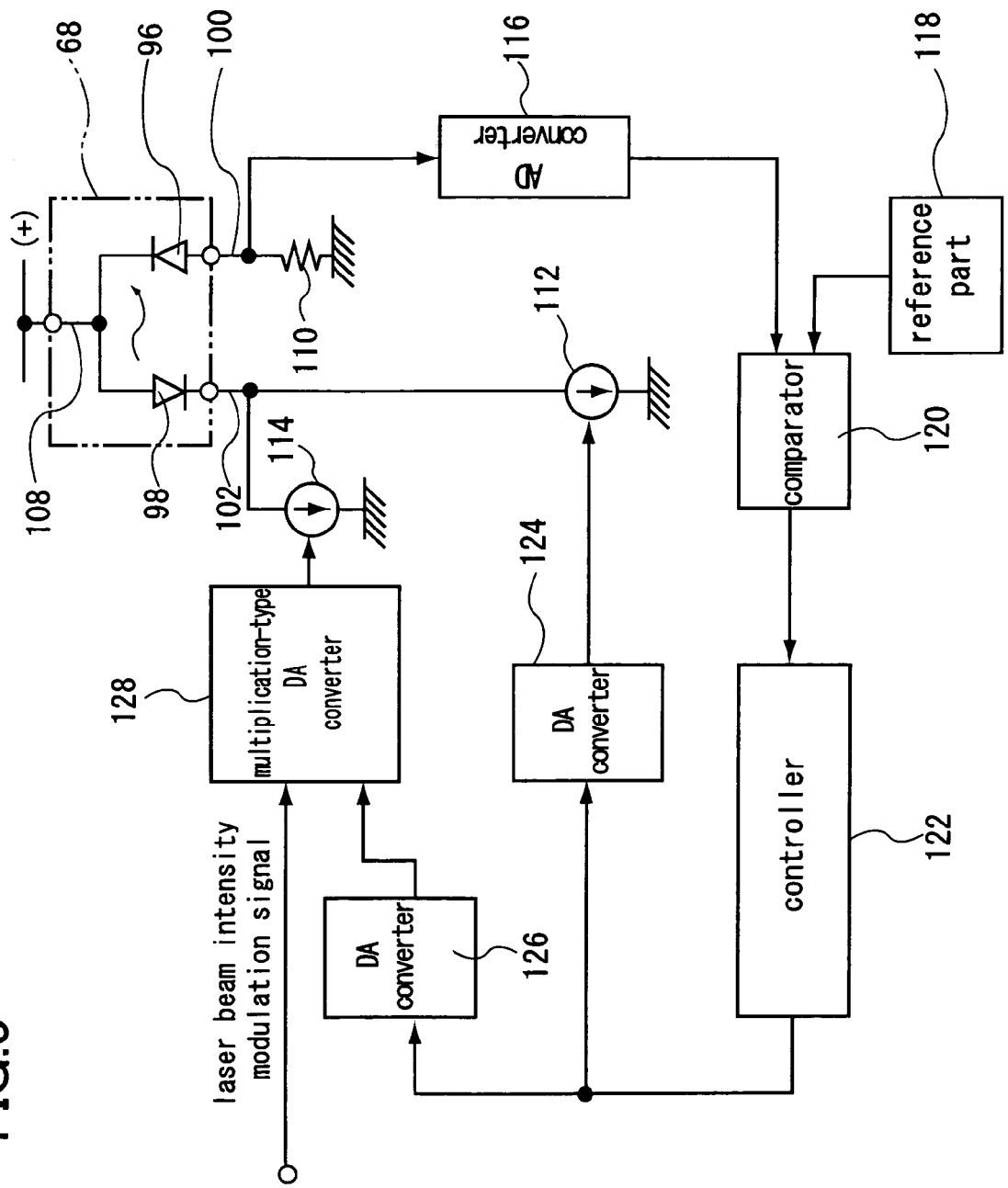
FIG. 5 is a block diagram showing a driver to drive the laser device according to the exemplary embodiment of the present invention.

FIG. 5 shows a driver to drive the laser device 68. The first lead 100 is grounded via a resistor 110. The second lead 102 is grounded via a first current regulator 112 and a second current regulator 114. The third lead 108 as a common electrode is connected to a constant voltage source of e.g. plus 5 V.

A voltage occurred between the both terminals of the resistor 110 is converted to a digital signal by an AD converter 116. The digital signal is compared with a reference digital voltage value generated by a reference part 118 by a comparator 120. The result of comparison by the comparator 120 is inputted into a controller 122 having e.g. a CPU. The controller 122 outputs a digital current regulation value corresponding to the input. The digital current regulation value is inputted into a first DA converter 124 and a second DA converter 126 and converted to analog current regulation values. A current flowing through the first current regulator 112 is regulated with the analog current regulation value converted by the first DA converter 124. Further, the analog current regulation value converted by the second DA converter 126 is inputted into a multiplication-type DA converter 128. The multiplication-type DA converter 128 inputs a laser intensity conversion signal, and outputs an analog current regulation value obtained by multiplying the laser intensity conversion signal by the analog current regulation value inputted from the second DA converter 126. A current flowing through the second current regulator 114 is regulated based on the analog current regulation value outputted from the multiplication-type DA converter 128.

In the above driver, when a laser modulation signal is inputted, a current flows through the light emitting element 98, then a laser beam is outputted from the light emitting element 98. At this time, monitor light is inputted into the light sensing element 96, and a current corresponding to the light quantity of the monitor light flows via the light sensing element 96. The current is converted to a voltage and compared with a reference value by the comparator 120. Then a regulation value is calculated by the controller 122, and the currents flowing through the first current regulator 112 and the second current regulator 114 are regulated. That is, as the variation of light quantity of the laser beam emitted from the light emitting element 98 in accordance with temperature or the like is monitored with the light sensing element 96 and feedback is performed, and a predetermined quantity of the laser beam, without variation due to temperature or the like, can be emitted.

Figure 6:
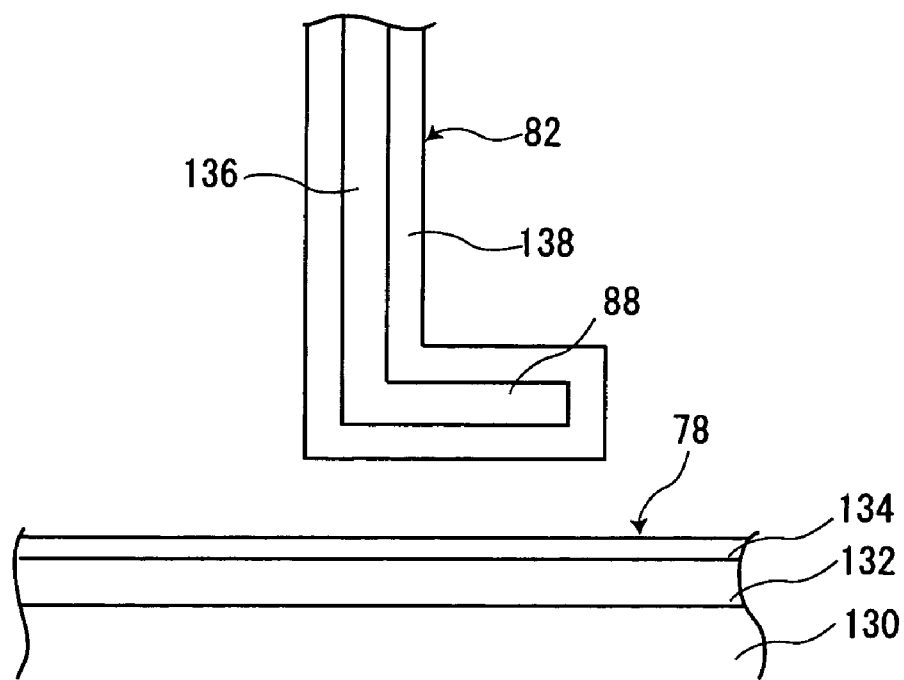
FIG. 6 is a cross-sectional view of a base 78 and a cap 82 before junction in the laser device according to the exemplary embodiment of the present invention.
Figure 7:
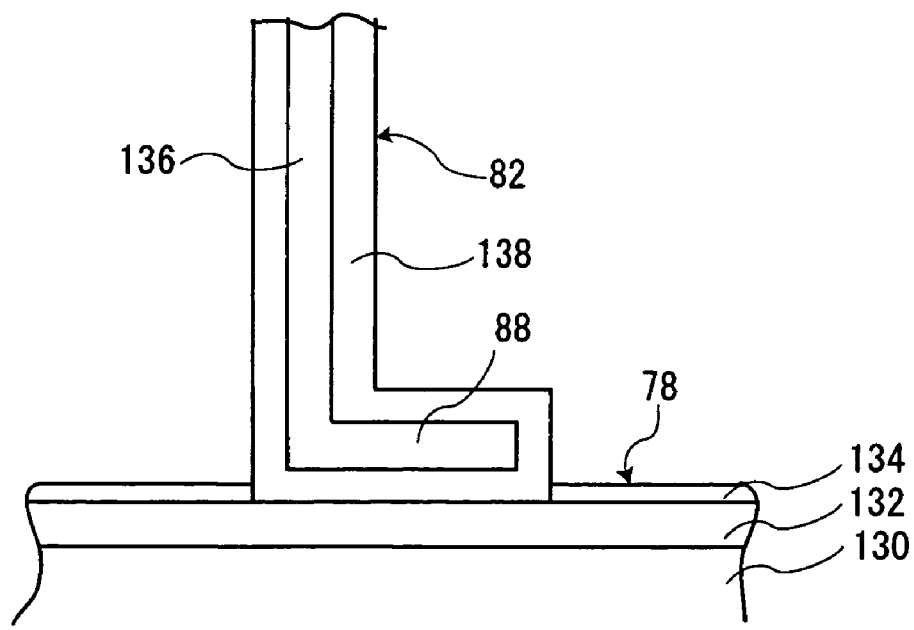
FIG. 7 is a cross-sectional view of the base 78 and the cap 82 after the junction in the laser device according to the exemplary embodiment of the present invention.

FIGS. 6 and 7 show the details of a joint portion between the base 78 and the cap 82. The base 78 has a nickel plated layer 132 as a first plated layer on a substrate 130 containing iron and nickel. The nickel plated layer 132 does not substantially contain phosphor. Note that, in the phrase "does not substantially containing phosphor", natural phosphor is excluded from "phosphor", and the amount of phosphor (natural phosphor) contained in the nickel plated layer is several ppm or less (less than 10 ppm). For example, an electroless nickel plated layer containing 0.1 to 2.0 wt % of boron is obtained by dipping a substrate in nickel-boron (Ni—B) plating solution containing boron. Otherwise, a nickel plated layer not substantially containing phosphor can be formed by electroplating.

As a second plated layer of the base 78, a gold plated layer 134 is formed. The gold plated layer 134 is formed by dipping the substrate 130, on which the nickel plated layer 132 is formed, in plating solution containing gold. The gold plated layer 134 has a thickness of 0.1 to 1.0 μm.

On the other hand, as the cap 82 has a simple shape, a nickel plated layer 138 by electroplating is formed on a substrate 136. The base 78 and the cap 82 are joined by e.g. resistance welding. The temperature of the joint portion upon resistance welding is 1400° C. to 1450° C. The melting temperature of the nickel plated layer 132 of the base 78 and the melting temperature of the nickel plated layer 138 of the cap 82 are both 1400° C. to 1450° C. while the melting temperature of the gold plated layer 134 is 1000° C. to 1100° C. As shown in FIG. 7, upon resistance welding, the nickel plated layer 132 and the nickel plated layer 138 are brought into contact with each other as alloy-junction, and a firm joint organization is formed. Further, as the hardness of the nickel plated layer 132 is 700 to 800 Hv (Vickers hardness), joint with reduced distortion can be performed. For example, even when the joint portion has irregularity, a small area of contact can be maintained, the resistance of the contact portion can be reduced, and heat generation by resistance can be reduced.

As the joint portion between the base 78 and the cap 82 does not substantially contain phosphor, leakage of phosphor component in the hermetically sealed space 90 does not substantially occur, and the probability of occurrence of sliver migration can be reduced.

Figure 8:
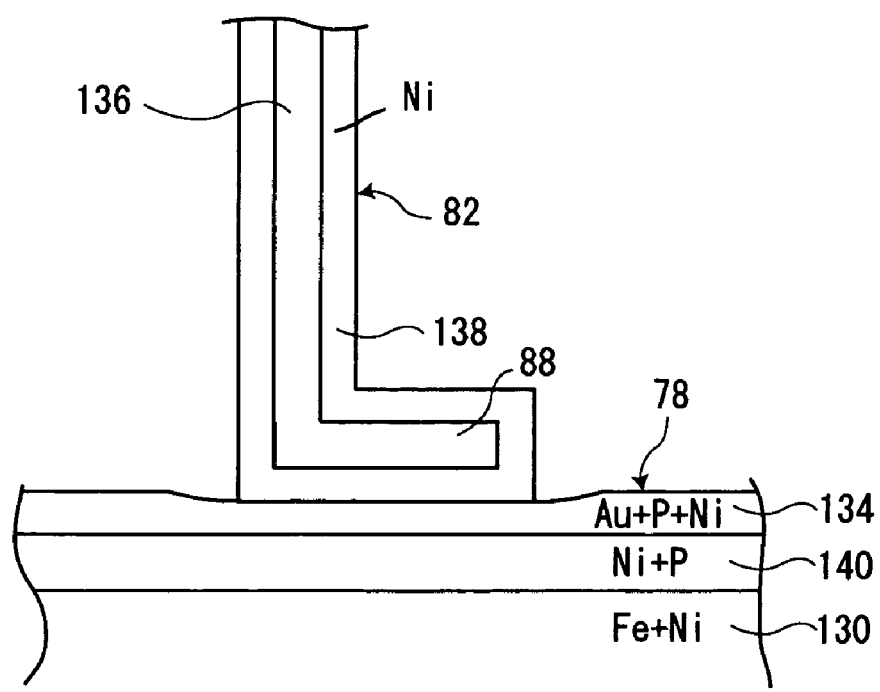
FIG. 8 is a cross-sectional view of the base 78 and the cap 82 after the junction in a comparative example.

FIG. 8 shows a comparative example regarding the joint portion between the base 78 and the cap 82. In the comparative example, as a first plated layer of the base 78, an electroless nickel plated layer 140 containing phosphor is formed. That is, the electroless nickel plated layer 140, formed by dipping a substrate in a nickel-phosphor (Ni—P) plating solution, contains 10 wt % of phosphor. The melting temperature of the electroless nickel plated layer 140 is about 900° C. As in the case of the above exemplary embodiment, the second plated layer of the base 78 is a gold plated layer, however, its thickness is equal to or greater than 1.0 μm since the contact resistance of the electroless nickel plated layer 140 is higher.

The temperature of the joint portion upon resistance welding is about 1200° C. The electroless nickel plated layer 140 first melts, then the phosphor in the electroless nickel plated layer 140 melts into the gold plated layer 134, then a part of the melted phosphor component sublimates at 250° C. or higher, and discharged as phosphoric acid ($P_2O_5$) into the hermetically sealed space 90. The discharged phosphoric acid having marked moisture absorption characteristic absorbs moisture in the hermetically sealed space 90, and ionized as follows.

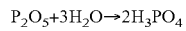

$P_2O_5 + 3H_2O \rightarrow 2H_3PO_4$

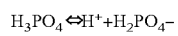

$H_3PO_4 \Leftrightarrow H^+ + H_2PO_4^-$

$H_2PO_4^- \Leftrightarrow H^+ + HPO_4^{2-}$

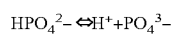

$HPO_4^{2-} \Leftrightarrow H^+ + PO_4^{3-}$

Figure 9:
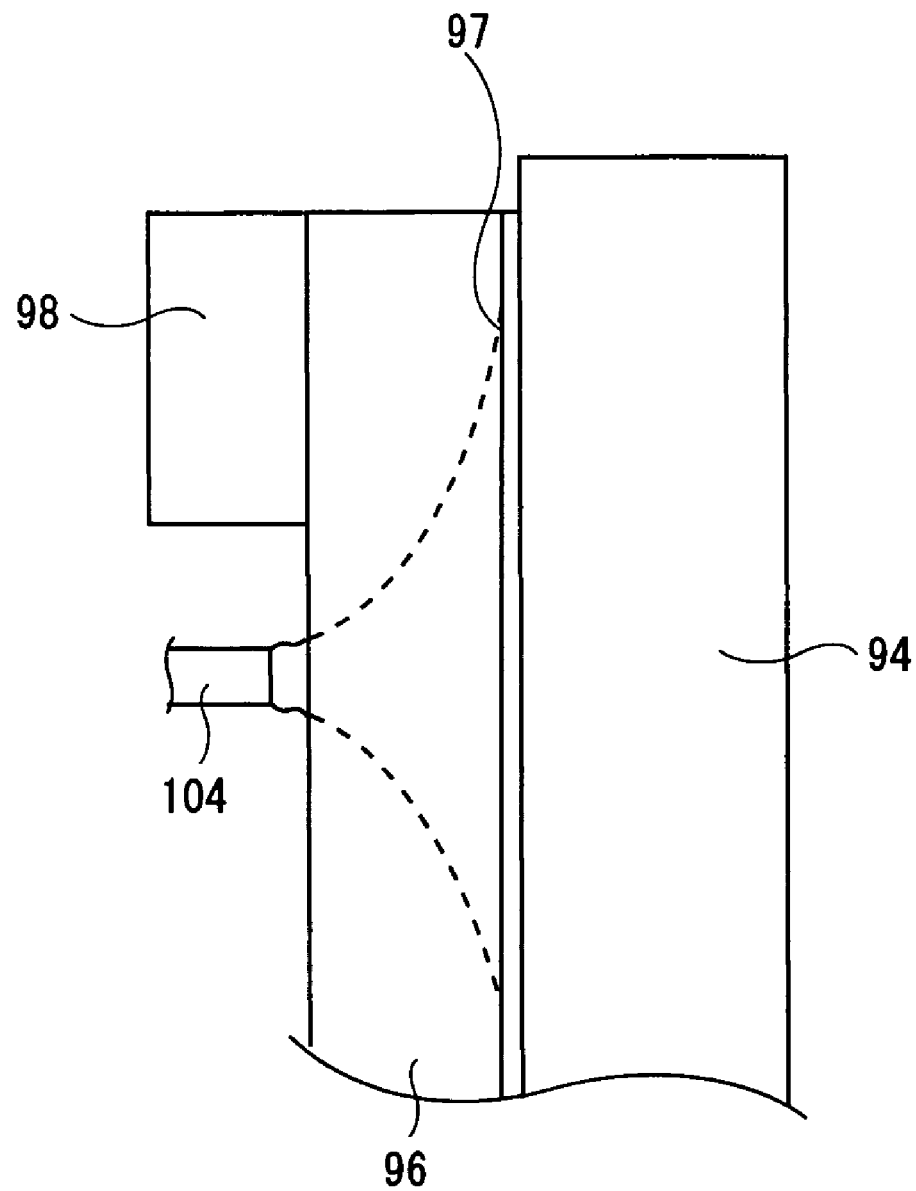
FIG. 9 is a cross-sectional view showing occurrence of silver migration in the laser device in the comparative example.

On the other hand, in the silver paste 97 connecting the holding base 94 and the light sensing element 96, as distortion remains in Ag elements existing among resin containing organic materials, the Ag element group is easily dissociated from the paste material. In this case, as silver (Ag) as a main component of the silver paste has a large ion radius (1.2 Å), dissociation is suppressed at normal times. However, as described above, as trivalent phosphor ions exist in the hermetically sealed space, dissociation of sliver is promoted. In the light sensing element, as the potential of the cathode terminal is higher than that of the anode terminal by an applied inverse bias voltage, the dissociated silver ions move from the cathode of the light sensing element 96 toward the anode by the electric field, and precipitate as silver. The dissociation and precipitation are repeated, thereby the precipitation of silver continues in an area surrounded with a dotted line in FIG. 9. As a result, the insulation distance between the cathode and the anode becomes short, or disappears. This phenomenon is silver migration.

In this manner, when the insulation distance of the light sensing element 96 becomes short or disappears, a leak current is generated between the terminals, and the light quantity of the monitor light from the light emitting element 98 cannot be correctly detected. As a result, feedback cannot be performed, and the quantity of light emission of the light emitting element 98 is reduced. When the quantity of light emission of the light emitting element 98 is reduced, image forming density is reduced in the image forming apparatus, and further, an image cannot be formed.

On the other hand, according to the above-described present exemplary embodiment of the present invention, as the nickel plated layer 132 of the base 78 does not substantially contain phosphor, the occurrence of silver migration can be prevented. Further, as an alloy is formed between the nickel plated layer 132 of the base 78 and the nickel plated layer 138 of the cap 82 upon resistance welding, the joint strength can be increased. Further, as the resistance of the joint portion can be reduced even when the thickness of the gold plated layer 134 is reduced, there is an economical merit.

Figure 10:
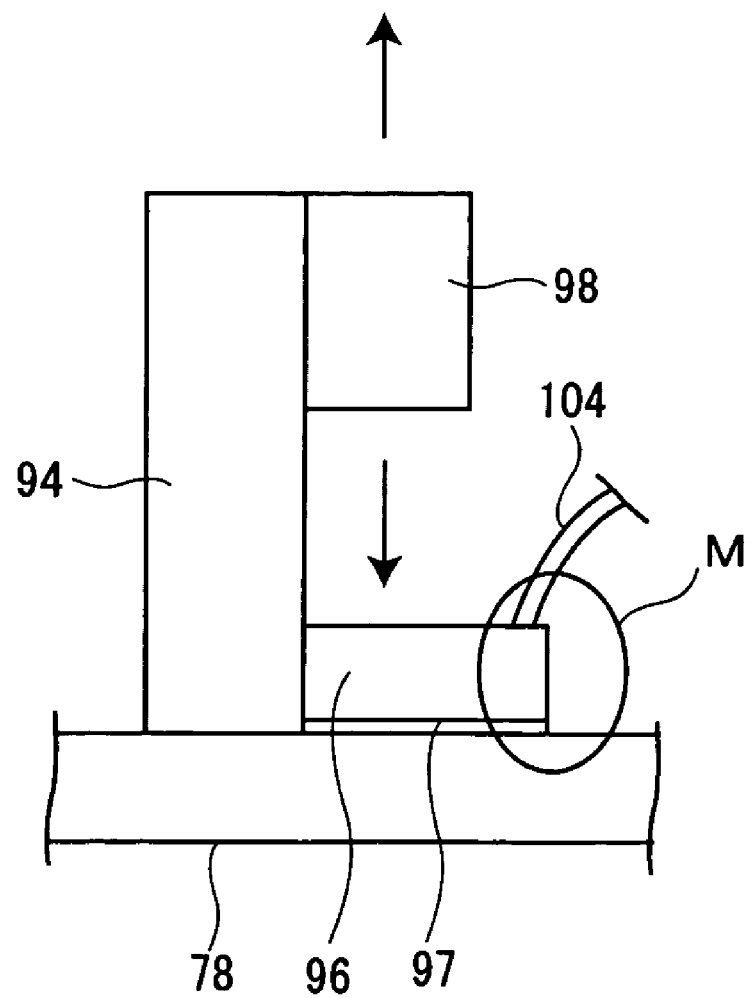
FIG. 10 is a side view of the laser device according to another exemplary embodiment of the present invention.

FIG. 10 shows another exemplary embodiment of the present invention. In the above-described previous exemplary embodiment, the light sensing element 96 is overlaid on the light emitting element 98, while in the present exemplary embodiment, the light sensing element 96 is fixed to the base 78 below the light emitting element 98, and the light sensing element 96 receives monitor light emitted from the light emitting element 98 below the light emitting element 98. In this case, as indicated with alphabet M, the anode and the cathode (a common electrode of the base 78) of the light sensing element 96 are joined via the silver paste 97, and there is a probability of occurrence of silver migration.

However, as described above, as the nickel plated layer of the base 78 does not substantially contain phosphor, the occurrence of silver migration can be prevented.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An electronic component comprising:
    a base;
    a seal body fixed to the base, constituting a hermetically sealed space together with the base having a transparent member; and
    an electronic component main body attached to a metal substrate via an adhesive containing silver within the hermetically sealed space having a wiring connected to an electrode and to one of leads protruding from the base,
    the base having a nickel plated layer containing boron and without any phosphor, on the seal body side.

2. The electronic component according to claim 1, wherein the nickel plated layer contains boron.

3. The electronic component according to claim 2, wherein the nickel plated layer contains 0.1 to 2.0 weight percent of boron.

4. The electronic component according to claim 1, wherein the nickel plated layer is an electroplated layer.

5. The electronic component according to claim 1, further comprising a gold plated layer as an upper layer of the nickel plated layer.

6. The electronic component according to claim 1, wherein the seal body has a nickel plated layer, substantially not containing phosphor, on the base side.

7. A laser device comprising:
    a base;
    a seal body fixed to the base, constituting a hermetically sealed space together with the base, and having a transparent member;
    a holding base provided within the hermetically sealed space;
    a light sensing element attached to the holding base via an adhesive containing silver and having a wiring connected to an electrode and to one of leads protruding from the base; and
    a light emitting element that emits a laser beam to the light sensing element and the transparent member,
    the base having a nickel plated layer containing boron and without any phosphor, on the seal body side.

8. An optical writing device comprising the laser device in claim 7, and further comprising a scanner that scans light emitted from the light emitting element through the transparent member.

9. An image forming apparatus comprising the optical writing device in claim 8, and further comprising a photoreceptor on which a latent image is formed with the light scanned by the scanner.

* * * * *